United States Patent [19]
McCollum

[11] Patent Number: 5,909,049
[45] Date of Patent: *Jun. 1, 1999

[54] ANTIFUSE PROGRAMMED PROM CELL

[75] Inventor: John L. McCollum, Saratoga, Calif.

[73] Assignee: Actel Corporation, Sunnyvale, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/797,202

[22] Filed: Feb. 11, 1997

[51] Int. Cl.$^6$ .................................................. H01L 29/00
[52] U.S. Cl. ........................................... 257/530; 257/209
[58] Field of Search ............................... 257/530, 50, 209

[56] References Cited

U.S. PATENT DOCUMENTS

| | | | |
|---|---|---|---|
| 3,191,151 | 6/1965 | Price | 340/166 |
| 3,204,127 | 8/1965 | Meier | 307/88.5 |
| 3,431,433 | 3/1969 | Ball et al. | 307/221 |
| 3,576,549 | 4/1971 | Hess | 340/173 |
| 3,582,908 | 6/1971 | Koo | 340/173 |
| 3,641,516 | 2/1972 | Castrucci et al. | 340/173 |
| 3,668,655 | 6/1972 | Allen | 340/173 |
| 3,699,395 | 10/1972 | Boleky | 317/101 |
| 3,699,403 | 10/1972 | Boleky, III | 317/235 |
| 3,699,543 | 10/1972 | Neale | 340/173 |
| 3,717,852 | 2/1973 | Abbas et al. | 340/173 |
| 3,733,690 | 5/1973 | Rizzi et al. | 29/577 |
| 3,742,592 | 7/1973 | Rizzi et al. | 29/574 |
| 3,750,115 | 7/1973 | Mundy | 340/173 |
| 3,781,977 | 1/1974 | Hulmes | 29/584 |
| 3,792,319 | 2/1974 | Tsang | 317/235 |
| 3,848,238 | 11/1974 | Rizzi et al. | 340/173 |
| 3,967,251 | 6/1976 | Levine | 340/172.5 |
| 4,099,260 | 7/1978 | Lynes et al. | 365/105 |
| 4,125,880 | 11/1978 | Taylor | 365/242 |
| 4,127,900 | 11/1978 | Raffel et al. | 365/191 |
| 4,146,902 | 3/1979 | Tanimoto et al. | 357/6 |
| 4,174,521 | 11/1979 | Neale | 357/45 |

(List continued on next page.)

FOREIGN PATENT DOCUMENTS

| | | | |
|---|---|---|---|
| 0 041 770 | 12/1981 | European Pat. Off. | G11C 17/00 |
| 0 053878 | 6/1982 | European Pat. Off. | G11C 11/34 |
| 0 068 058 | 1/1983 | European Pat. Off. | G11C 17/00 |
| 0 089 457 | 9/1983 | European Pat. Off. | G11C 17/00 |
| 0 118 158 | 9/1984 | European Pat. Off. | H01L 29/68 |
| 0 162 529 | 11/1985 | European Pat. Off. | H01L 29/32 |

(List continued on next page.)

OTHER PUBLICATIONS

Bursky, "Oxide–Isolated Process Uses Vertical Fuses to Yield Fast PROMs and Logic", Jun. 1984, Electronic Design, pp. 41–42.

Cook, "Amorphous Silcon Antifuse Technology for Bipolar PROMs", 1986, IEEE, Bipolar Circuits and Technology Meeting, pp. 99–100.

(List continued on next page.)

*Primary Examiner*—J. Carroll
*Attorney, Agent, or Firm*—D'Alessandro & Ritchie

[57] ABSTRACT

An antifuse based PROM cell design allows large currents to be sinked during cell programming to ensure low programmed resistance of the cell while using minimum-geometry select devices. This is achieved by utilizing a pseudo SCR latchup effect during programming. The regions in the semiconductor substrate forming lower antifuse electrodes for the antifuses in the PROM cells are doped at low levels with phosphorus. An antifuse layer formed from an oxide, oxide-nitride, or oxide-nitride-oxide antifuse layer, is formed over the lower antifuse electrode, and an upper antifuse electrode is formed from polysilicon. A minimum-geometry N-Channel select transistor is formed in series with the antifuse to complete the PROM cell. The drain and source diffusions of the select transistor are arsenic doped and the drain diffusion is contiguous with the lower antifuse electrode. A bit line is contacted to the upper antifuse electrode and the select transistor gate is part of a polysilicon word line. The source diffusion of the select transistor is grounded.

11 Claims, 3 Drawing Sheets

U.S. PATENT DOCUMENTS

| | | | |
|---|---|---|---|
| 4,177,475 | 12/1979 | Holmberg | 357/2 |
| 4,203,123 | 5/1980 | Shanks | 357/2 |
| 4,208,727 | 6/1980 | Redwine et al. | 365/105 |
| 4,209,894 | 7/1980 | Keen | 29/577 |
| 4,238,839 | 12/1980 | Redfern et al. | 365/96 |
| 4,253,059 | 2/1981 | Bell et al. | 324/73 |
| 4,257,832 | 3/1981 | Schwabe et al. | 148/187 |
| 4,281,398 | 7/1981 | McKenny et al. | 365/200 |
| 4,322,822 | 3/1982 | McPherson | 365/182 |
| 4,323,986 | 4/1982 | Malaviva | 365/174 |
| 4,347,586 | 8/1982 | Natsui | 365/174 |
| 4,399,450 | 8/1983 | Lohstroh | 357/59 |
| 4,404,581 | 9/1983 | Tam et al. | 357/59 |
| 4,418,403 | 11/1983 | O'Toole et al. | 365/201 |
| 4,420,504 | 12/1983 | Cooper et al. | 427/90 |
| 4,420,820 | 12/1983 | Preedy | 365/105 |
| 4,424,578 | 1/1984 | Miyamoto | 365/104 |
| 4,424,579 | 1/1984 | Roesner | 365/105 |
| 4,441,167 | 4/1984 | Principi | 365/94 |
| 4,442,507 | 4/1984 | Roesner | 365/100 |
| 4,488,262 | 12/1984 | Basire et al. | 365/104 |
| 4,494,135 | 1/1985 | Moussie | 357/59 |
| 4,499,557 | 2/1985 | Holmberg et al. | 365/163 |
| 4,502,208 | 3/1985 | McPherson | 29/584 |
| 4,507,673 | 3/1985 | Aoyama et al. | 357/23 |
| 4,507,757 | 3/1985 | McElroy | 365/104 |
| 4,553,225 | 11/1985 | Ohe | 365/201 |
| 4,565,712 | 1/1986 | Noguchi et al. | 427/53.1 |
| 4,565,932 | 1/1986 | Kuo et al. | 307/264 |
| 4,569,120 | 2/1986 | Stacy et al. | 29/574 |
| 4,569,121 | 2/1986 | Lim et al. | 29/574 |
| 4,590,589 | 5/1986 | Gerzberg | 365/100 |
| 4,595,875 | 6/1986 | Chan et al. | 324/73 |
| 4,597,062 | 6/1986 | Asano et al. | 365/201 |
| 4,598,386 | 7/1986 | Roesner et al. | 365/105 |
| 4,599,705 | 7/1986 | Holmberg et al. | 365/163 |
| 4,601,034 | 7/1986 | Sridhar | 371/25 |
| 4,612,630 | 9/1986 | Rosier | 365/201 |
| 4,613,886 | 9/1986 | Chwang | 357/42 |
| 4,646,264 | 2/1987 | Massuzaki | 365/104 |
| 4,647,340 | 3/1987 | Szluk et al. | 156/662 |
| 4,651,304 | 3/1987 | Takata | 365/201 |
| 4,653,029 | 3/1987 | Sato | 365/205 |
| 4,658,380 | 4/1987 | Eby | 365/201 |
| 4,692,787 | 9/1987 | Possley et al. | 357/59 |
| 4,698,589 | 10/1987 | Blankenship et al. | 324/158 |
| 4,725,985 | 2/1988 | Ogura et al. | 365/201 |
| 4,742,492 | 5/1988 | Smayling et al. | 365/218 |
| 4,748,490 | 5/1988 | Hollingsworth | 357/51 |
| 4,750,155 | 6/1988 | Hsieh | 365/203 |
| 4,782,466 | 11/1988 | Yamaguchi et al. | 365/149 |
| 4,782,487 | 11/1988 | Smelser | 371/21 |
| 4,792,835 | 12/1988 | Sacarisen et al. | 357/23.6 |
| 4,796,074 | 1/1989 | Roesner | 357/51 |
| 4,821,233 | 4/1989 | Hsieh | 365/203 |
| 4,822,750 | 4/1989 | Perlegos et al. | 437/52 |
| 4,839,864 | 6/1989 | Fujishima | 365/200 |
| 4,851,361 | 7/1989 | Schumann et al. | 437/30 |
| 4,851,364 | 7/1989 | Yatsuda et al. | 437/42 |
| 4,876,220 | 10/1989 | Mohsen et al. | 437/170 |
| 4,878,199 | 10/1989 | Mizutani | 365/185 |
| 4,881,114 | 11/1989 | Mohsen et al. | 357/54 |
| 4,899,205 | 2/1990 | Hamdy et al. | 357/51 |
| 4,901,128 | 2/1990 | Sunami et al. | 357/23.6 |
| 4,903,266 | 2/1990 | Hack | 371/21.2 |
| 4,908,799 | 3/1990 | Gaudronneau | 365/241 |
| 4,933,735 | 6/1990 | Potash et al. | 357/45 |
| 4,958,324 | 9/1990 | Devin | 365/201 |
| 4,963,825 | 10/1990 | Mielke | 324/158 |
| 5,015,885 | 5/1991 | El Gamal et al. | 307/465 |
| 5,027,320 | 6/1991 | Pathak et al. | 365/185 |
| 5,056,089 | 10/1991 | Furuta et al. | 371/3 |
| 5,075,249 | 12/1991 | Sato et al. | 257/530 |
| 5,079,746 | 1/1992 | Sato | 365/225.7 |
| 5,086,008 | 2/1992 | Riva | 437/41 |
| 5,086,331 | 2/1992 | Hartgring et al. | 257/530 |
| 5,091,908 | 2/1992 | Zorian | 371/21.5 |
| 5,093,711 | 3/1992 | Hirakawa | 357/71 |
| 5,101,409 | 3/1992 | Hack | 371/21.3 |
| 5,107,501 | 4/1992 | Zorian | 371/213 |
| 5,113,238 | 5/1992 | Wang et al. | 357/54 |
| 5,126,290 | 6/1992 | Lowrey et al. | 437/235 |
| 5,134,584 | 7/1992 | Boler et al. | 365/200 |
| 5,138,619 | 8/1992 | Fasang et al. | 371/21.1 |
| 5,148,390 | 9/1992 | Hsieh | 365/95 |
| 5,163,180 | 11/1992 | Eltoukhy et al. | 257/530 |
| 5,166,901 | 11/1992 | Shaw et al. | 365/105 |
| 5,191,550 | 3/1993 | Kubota | 365/96 |
| 5,208,177 | 5/1993 | Lee | 437/47 |
| 5,224,101 | 6/1993 | Popyack, Jr. | 371/21.1 |
| 5,233,206 | 8/1993 | Lee et al. | 257/50 |
| 5,241,496 | 8/1993 | Lowrey et al. | 365/96 |
| 5,242,851 | 9/1993 | Choi | 437/49 |
| 5,245,569 | 9/1993 | Gonzalez et al. | 365/182 |
| 5,247,477 | 9/1993 | Norman | 365/185 |
| 5,262,994 | 11/1993 | McClure | 365/200 |
| 5,265,054 | 11/1993 | McClure | 365/200 |
| 5,268,598 | 12/1993 | Pedersen et al. | 307/465 |
| 5,278,784 | 1/1994 | Ishihara et al. | 365/96 |
| 5,282,158 | 1/1994 | Lee | 365/96 |
| 5,286,993 | 2/1994 | Lowrey et al. | 257/390 |
| 5,295,102 | 3/1994 | McClure | 365/200 |
| 5,299,151 | 3/1994 | Ishihara et al. | 365/96 |
| 5,299,152 | 3/1994 | Ishihara et al. | 365/96 |
| 5,311,039 | 5/1994 | Kimura et al. | 257/50 |
| 5,323,353 | 6/1994 | Griffus et al. | 365/226 |
| 5,325,367 | 6/1994 | Dekker et al. | 371/21.1 |
| 5,329,487 | 7/1994 | Gupta et al. | 365/185 |
| 5,353,248 | 10/1994 | Gupta | 365/154 |
| 5,355,340 | 10/1994 | Coker et al. | 365/200 |
| 5,357,523 | 10/1994 | Bogholtz, Jr. et al. | 371/27 |
| 5,371,748 | 12/1994 | Saw et al. | 371/27 |
| 5,379,250 | 1/1995 | Harshfield | 365/105 |
| 5,391,518 | 2/1995 | Bhushan | 437/190 |
| 5,401,993 | 3/1995 | Yamauchi et al. | 257/321 |
| 5,426,614 | 6/1995 | Harward | 365/225.7 |
| 5,459,693 | 10/1995 | Komarek et al. | 365/207 |
| 5,469,379 | 11/1995 | Levy | 365/96 |
| 5,488,586 | 1/1996 | Madurawe et al. | 365/218 |
| 5,493,526 | 2/1996 | Turner et al. | 365/185.33 |
| 5,495,436 | 2/1996 | Callahan | 365/96 |
| 5,523,971 | 6/1996 | Rao | 365/187.07 |
| 5,526,322 | 6/1996 | Lee | 365/233.5 |
| 5,561,315 | 10/1996 | Van Dort | 257/530 |
| 5,566,123 | 10/1996 | Freidin et al. | 365/230.05 |
| 5,572,148 | 11/1996 | Lytle et al. | 326/41 |
| 5,572,458 | 11/1996 | Smith et al. | 365/96 |
| 5,576,985 | 11/1996 | Holtz | 365/49 |
| 5,581,501 | 12/1996 | Sansbury et al. | 365/185.01 |
| 5,594,690 | 1/1997 | Rothenberger et al. | 365/189.01 |
| 5,596,544 | 1/1997 | Komarek et al. | 365/233.5 |
| 5,619,063 | 4/1997 | Chen et al. | 257/530 |
| 5,646,438 | 7/1997 | Frerichs | 257/530 |
| 5,646,879 | 7/1997 | Harshfield | 365/105 |
| 5,648,934 | 7/1997 | O'Toole | 365/200 |
| 5,657,293 | 8/1997 | Merritt et al. | 365/233.5 |
| 5,659,496 | 8/1997 | Levy et al. | 365/96 |
| 5,661,056 | 8/1997 | Takeuchi | 438/261 |

FOREIGN PATENT DOCUMENTS

| | | | |
|---|---|---|---|
| 0 172 193 | 2/1986 | European Pat. Off. | H01L 29/68 |
| 0 515 039 | 11/1992 | European Pat. Off. | G11C 16/04 |

| | | | | |
|---|---|---|---|---|
| 0 528 417 | 2/1993 | European Pat. Off. | ........ | G11C 17/16 |
| 0 539 197 | 4/1993 | European Pat. Off. | ...... | H01L 23/525 |
| 0 646 966 | 4/1995 | European Pat. Off. | ...... | H01L 27/115 |
| 0 663 665 | 7/1995 | European Pat. Off. | .......... | G11C 7/00 |
| 0 663 669 | 7/1995 | European Pat. Off. | ........ | G11C 17/16 |
| 2 367 352 | 5/1978 | France | ............ | H01L 27/06 |
| 2 530 383 | 1/1984 | France | ............ | H01L 29/52 |
| 39 27 033 | 8/1989 | Germany | ....................... | H01L 45/00 |
| 58-028750 | 6/1983 | Japan | ............. | H01L 27/10 |
| 59-168665 | 9/1984 | Japan | ............. | G11C 11/34 |
| 60-74669 | 4/1985 | Japan | ............. | H01L 27/10 |
| 60-242678 | 4/1986 | Japan | ............. | H01L 29/78 |
| 63-064361 | 3/1988 | Japan | ............. | H01L 27/10 |
| 2-208962 | 8/1990 | Japan | ............. | H01L 27/10 |
| 4-246856 | 1/1993 | Japan | ............. | H01L 27/112 |
| 5-198819 | 11/1993 | Japan | ........... | H01L 29/788 |
| 6-112322 | 4/1994 | Japan | ............. | H01L 21/82 |
| 6-120440 | 4/1994 | Japan | ............. | H01L 27/10 |
| 6-295593 | 10/1994 | Japan | ............. | G11C 29/00 |
| 6-295594 | 10/1994 | Japan | ............. | G11C 29/00 |
| 6-295991 | 10/1994 | Japan | ............. | H01L 27/10 |
| 7-176772 | 7/1995 | Japan | ............. | H01L 29/88 |
| 7-183385 | 7/1995 | Japan | ............. | H01L 21/82 |
| 7-507181 | 8/1995 | Japan | ............. | H01L 21/82 |
| 8-023080 | 1/1996 | Japan | ............. | H01L 27/10 |
| 8-213483 | 8/1996 | Japan | ........... | H01L 21/8246 |
| 1 422 045 | 1/1976 | United Kingdom | ............ | H01L 27/10 |
| 85/03599 | 8/1985 | WIPO | ............ | H01L 29/68 |
| 87/06059 | 10/1987 | WIPO | ............ | H01L 21/82 |
| 92/22088 | 12/1992 | WIPO | ........... | H01L 21/3205 |
| 93/03499 | 2/1993 | WIPO | ........... | H01L 23/525 |

OTHER PUBLICATIONS

Fukushima, "An Advanced SVG Technology for 64K Junction–Shorting PROM's", Dec. 1983, IEEE, Transactions on Electron Devices, vol. ED–30, No. 12, pp. 1785–1791.

Fukushima, "A 40 ns 64 kbit Junction–Shorting PROM", Apr. 1984, IEEE, Journal of Solid–State Circuits, vol. SC–19, No. 2, pp. 187–194.

Hamdy, "Dielectric Based Antifuse for Logic and Memory ICs", 1988, IEEE, IEDM, pp. 786–789.

Iseoff, "Characterizing Quickturn ASICs: It's Done with Mirrors", Aug. 1990. Semiconductor International.

Sato, "A New Programmable Cell Utilizing Insulator Breakdown", 1985, IEEE, IEDM, pp. 639–642.

Tanimoto, "A Novel MOS PROM Using a Highly Resistive Poly–Si Resistor", Mar. 1980, IEEE, Transactions on Electron Devices, vol. ED–27, No. 3, pp. 517–520.-

5,909,049

ANTIFUSE PROGRAMMED PROM CELL

BACKGROUND OF THE INVENTION

1. Field of the Invention

The present invention relates to antifuse technology. More particularly, the present invention relates to a novel programmable read only memory cell fabricated using antifuse technology.

2. The Prior Art

In applications employing normal ONO antifuses having their lower electrodes disposed in the silicon substrate, substrate regions comprising lower antifuse electrodes have typically been doped to very high levels (i.e., 1e20) with arsenic, usually in the same masking step used to form source/drain diffusions for active devices in the substrate.

Programming antifuses often takes a large amount of current, in excess of 4 mA and as much as 15 mA if an output impedance of 250 ohms or less is desired in the programmed antifuse. This means that a rather large MOS transistor is required, as much as 20 $\mu$.

This large transistor size is rather prohibitive for programmable read only memory (PROM) cells. The tradeoff between on resistances of programmed antifuse PROM cells higher than 250 ohms and the need for such large select transistors has been unacceptable in the prior art.

BRIEF DESCRIPTION OF THE INVENTION

A novel antifuse based PROM cell design allows large currents to be sinked during cell programming to ensure low programmed resistance of the cell antifuse while using minimum-geometry select devices. This is achieved by utilizing a pseudo SCR latchup effect during programming.

In this invention the regions in the semiconductor substrate forming lower antifuse electrodes for the antifuses in the PROM cells are doped at low levels, i.e., around 1e18, with phosphorus. An antifuse layer formed from an oxide, oxide-nitride, or oxide-nitride-oxide antifuse layer, is formed over the lower antifuse electrode, and an upper antifuse electrode is formed from polysilicon.

A minimum-geometry N-Channel select transistor is formed in series with the antifuse to complete the PROM cell. The drain and source diffusions of the select transistor are arsenic doped and the drain diffusion is contiguous with the lower antifuse electrode. A bit line is contacted to the upper antifuse electrode and the select transistor gate is part of a polysilicon word line. The source diffusion of the select transistor is grounded.

An array of antifuse PROM cells according to the present invention may be formed in closely spaced orientation having common polysilicon word lines and metal interconnect layer bit lines.

BRIEF DESCRIPTION OF THE DRAWING FIGURES

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons.

Figure 1:
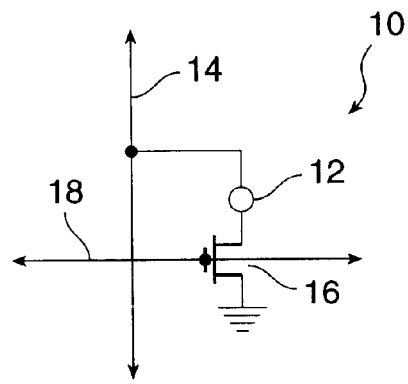
FIG. 1 is a schematic diagram of a PROM cell according to the present invention.

Referring first to FIG. 1, a schematic diagram of a PROM cell 10 according to the present invention is presented. PROM cell 10 comprises an antifuse 12 connected between a bit line 14 and the drain of an N-Channel MOS select transistor 16. The gate of the N-Channel MOS select transistor 16 is connected to a word line 18 and the source of the N-Channel MOS select transistor 16 is connected to ground. The N-Channel select transistor may be formed at the minimum feature size for the fabrication technology employed.

The antifuse is of the type disclosed in U.S. Pat. No. 4,823,181 to Mohsen et al., and in U.S. Pat. No. 4,899,205 to Hamdy et al. The lower electrode of the antifuse 12 is formed from a diffused region in a p-type semiconductor substrate, preferably a P+epi substrate as is known in the art. However, instead of following the teachings of the prior art and forming the lower antifuse electrode from a heavily doped arsenic region in the substrate, the lower antifuse electrode is formed from a lightly doped phosphorus region. According to a presently preferred embodiment of the invention, the lower electrode of the antifuse is formed from a phosphorus diffusion doped to a concentration of between about 1e17 and about 1e19.

An antifuse layer preferably comprising an oxide, oxide-nitride, or oxide-nitride-oxide antifuse layer, as known in the prior art, is formed over the lower antifuse electrode, and an upper antifuse electrode is formed from heavily doped polysilicon preferably as taught by Hamdy et al. in U.S. Pat. No. 4,899,205.

Figure 2:
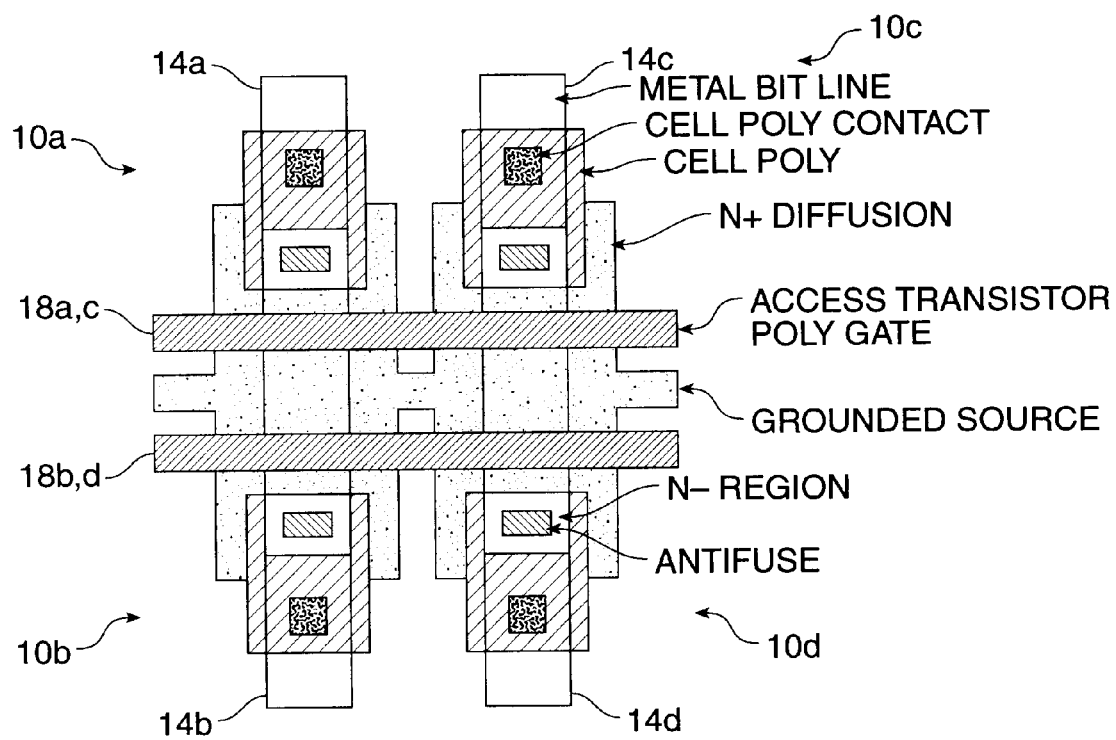
FIG. 2 is a top view of the layout of a group of four PROM cells fabricated on a p-type substrate with an N-Channel select transistor and an antifuse as the programming element.
Figure 3:
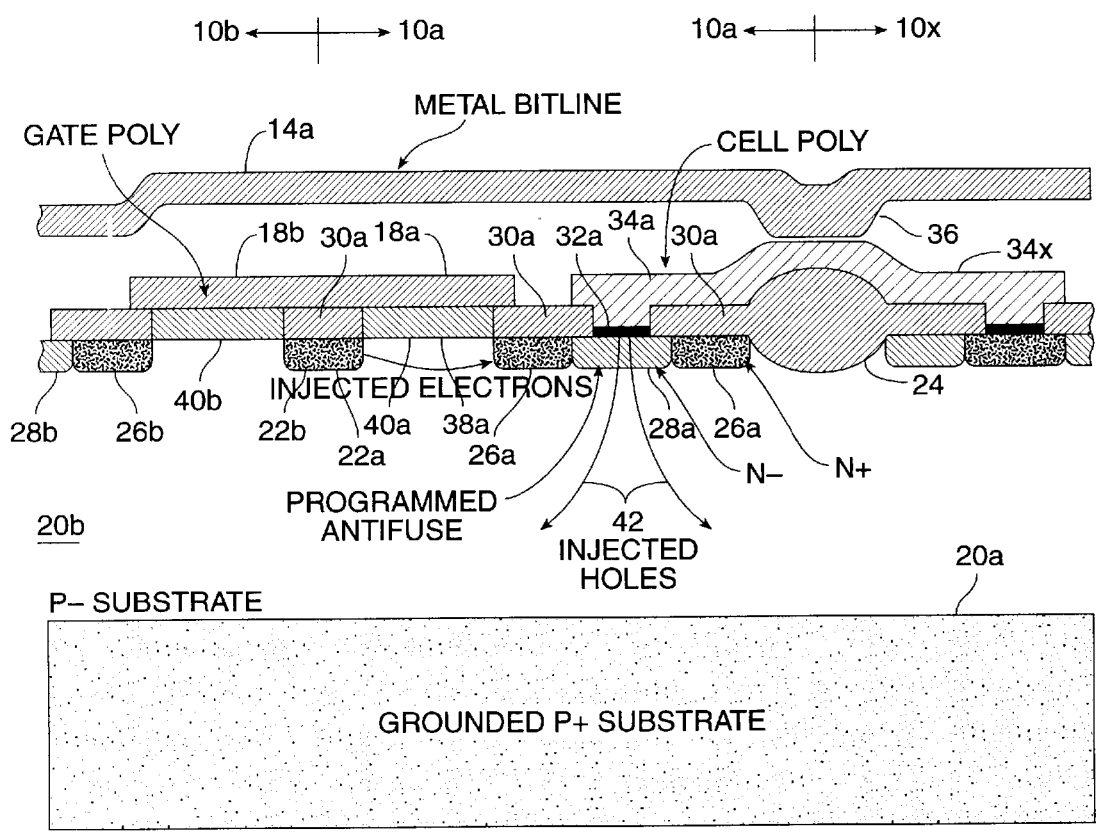
FIG. 3 is a cross sectional view of a single one of the PROM cells of the view of FIG. 2, taken through the center of one of the metal lines.

Referring now to FIG. 2, a top view is presented of the layout of a group of four PROM cells 10a, 10b, 10c, and 10d fabricated on a grounded p-type substrate comprising a P+ region 20a and an epitaxial P- region 20b. Each cell employs an antifuse as the programming element with an N-Channel select transistor. FIG. 3 is a cross sectional view through the substrate at the center of a pair of the PROM cells of the present invention. Viewing FIGS. 2 and 3 together will facilitate an understanding of the present invention.

Reference is made to cell 10a in the upper left-hand corner of FIG. 2 for a disclosure of the PROM cell of the present invention. Cells 10b, 10c, and 10d are virtually identical mirror images of cell 10a. Elements in each of the PROM cells in FIG. 2 will be given the alphabetical suffix corresponding to the alphabetical suffix of their cell's reference numeral. For the purposes of this disclosure, FIG. 3 will be assumed to depict all of PROM cell 10a and a portion of PROM cell 10b, as well as a portion of an unidentified cell at the right hand side of the figure. In both FIGS. 2 and 3, elements of FIG. 1 which appear therein will be given the same reference numerals as in FIG. 1, followed of course by the appropriate alphabetical suffix.

Bit line 14 of FIG. 1 is a metal line running vertically in FIG. 2 on both the left and right portions of the figure. The metal line at the left portion of FIG. 2 is bit line 14a in the top half of the figure and bit line 14b in the bottom half of the figure. The metal line at the right portion of FIG. 2 is bit line 14c in the top half of the figure and bit line 14d in the bottom half of the figure.

Word line 18 of FIG. 1 is a polysilicon line running horizontally in FIG. 2 on both the top and bottom portions of the figure. The polysilicon line at the top portion of FIG. 2 is bit line 18a in the left half of the figure and bit line 18c in the right half of the figure. The polysilicon line at the bottom portion of FIG. 2 is bit line 18b in the left half of the figure and bit line 18d in the right half of the figure.

PROM cell 10a in FIG. 3 starts on the left at diffused region 22a and 22b which forms the source diffusion for the N-Channel select transistor of PROM cell 10a as well as the source of the N-Channel select transistor of PROM cell 10b mirrored to the left. PROM cell 10a ends on the right at the center of field oxide region 24. Everything to the right of the center of field oxide region 24 is a portion of another PROM cell mirrored to the right.

Referring still to FIG. 3, immediately to the left of field oxide region 24 is an N+ diffused region 26a including an N− diffused region 28a in its center. N− region 28a comprises a phosphorus doped region at a concentration of between about 1e17 and about 1e19, and forms the lower antifuse electrode. The surrounding N+ region 26a comprises an arsenic doped region at a concentration of between about 1e19 and about 1e21, preferably about 1e20, and forms the drain of N-Channel MOS select transistor 16 of FIG. 1. The fact that regions 26a and 28a are contiguous assures connection between the lower antifuse electrode and the drain of the select transistor.

As best seen in FIG. 3, an oxide layer 30a is disposed over diffused regions 26a and 28a. Antifuse layer 32a is disposed in an aperture formed in the oxide layer 30a in alignment with diffused region 28a. As presently preferred, antifuse layer 32a comprises about 35 angstroms of thermal silicon dioxide, about 65 angstroms of deposited silicon nitride, and about 25 angstroms of thermal silicon dioxide converted from the layer of silicon nitride.

The left half of a polysilicon layer identified by reference numeral 34a forms the upper electrode of antifuse 12a. The right half of that same polysilicon layer 34x forms the upper electrode of an antifuse 12x in a neighboring cell. Metal line 14a connects to polysilicon layer 34a at contact region 36.

To the left of diffused region 26a a channel 38a for the select transistor is bounded on its left by diffused region 22a, the source of the N-Channel MOS select transistor 16a. Diffused region 22b, the left half of the same diffusion, begins PROM cell 10b as the source of the N-Channel MOS select transistor 16b. This diffusion is connected to ground.

A gate oxide region 40a overlying channel region 38a, separates channel region 38a from the polysilicon word line 18a,c of FIG. 2 and a gate oxide region 40b overlying channel region 38b, separates channel region 38b from the polysilicon word line 18b,d of FIG. 2. In FIG. 3, the rightmost polysilicon strip is the portion 18a of polysilicon word line 18a,c of FIG. 2 which forms the gate of N-Channel MOS select transistor 16a, and the leftmost polysilicon strip is the portion 18b of the polysilicon word line 18b,d which forms the gate of N-Channel MOS select transistor 16a. Another portion of oxide layer 30a is shown in FIG. 3 disposed above polysilicon gates 18a and 18b.

As will be appreciated by those of ordinary skill in the art, the structures of PROM cells 10b, 10c, and 10d would be apparent from the above disclosure of PROM cell 10a.

The PROM cell of the present invention may be fabricated as a part of a conventional CMOS semiconductor fabrication process. The process preferably starts with a P+ substrate including a P− epitaxial layer formed thereon. Conventional front end steps are performed to create field oxide channel stop regions for all active devices to be formed on the substrate. Field oxide region 24 of FIG. 3 is created at this time.

Assuming the transistor devices are formed using self-aligned gate techniques, a gate oxide layer is formed and a polysilicon layer is deposited thereover, doped, and defined to form the word lines and select transistor gates. Next, the N+ and N− regions for the antifuse and select transistors are formed using conventional CMOS implant techniques. Persons of ordinary skill in the art will recognize that the step for formation of the N− region for the lower antifuse electrode may already be present in a CMOS process for formation of lightly-doped drain (LDD) regions for other transistors. In such an event, the lower antifuse electrode may be formed simply by including the additional apertures in the LDD mask already used in the process. Otherwise a second implant step will be inserted into the process to form the N− lower antifuse electrode diffusion.

Next, an oxide layer is formed to cover the word line polysilicon and form the interlayer dielectric for the antifuses. Masking and etching steps are then performed to form the antifuse apertures and the antifuse dielectrics are formed in the apertures. Conventional semiconductor processing techniques are then used to form another insulating layer through which contact apertures (including the contact for the metal to cell polysilicon connection) are etched as is known in the art. A metal interconnect layer is deposited and defined over that layer to form the metal bit line. Conventional rear-end steps are then performed to complete the semiconductor structure.

In the case when programming of the PROM cell 10a is performed with a positive voltage in the range of from about 10 to about 18 volts, depending on the overall dielectric thickness and composition, applied to the upper electrode 34a of the antifuse via metal line 14a, the antifuse layer 32a will break down and the local temperature of the N-diffused region 28a will exceed the melting point of the silicon. A large quantity of holes and electrons will be generated in this process. The electrons will flow to the top plate and the holes will flow into the N− diffused region 28a.

Since N− region 28a is doped lightly, the probability of the holes recombining is very small. Thus, the holes flow straight to the grounded P+ substrate 20 as shown in FIG. 3 by arrows 42. To maintain this current flow a voltage of at least 2.5 volts must be maintained across the antifuse dielectric. The N-diffused region 28a must therefore receive a supply of electrons from ground.

These electrons are initially supplied by the N-Channel select transistor 16a. If the demand for this current is exceeded, the localized substrate potential will be raised by the injected holes thus forward biasing the source of the N-Channel select transistor 16a. This condition will supply any excess electrons required. Those of ordinary skill in the art will appreciate that, under these conditions, any amount of programming current can be achieved.

The SCR action of the antifuse structure depicted in FIGS. 2 and 3 relies on a "virtual" P+ region at the top of the N− region 28a caused by the melting silicon material during the programming process. The hot spot in the silicon generated by the breakdown of the dielectric during programming is a source of holes just as a P+ region would be in normal semiconductor operation. Since the programming process generates temperatures in excess of the melting point of the silicon in region 28a, holes and electrons are produced in large numbers. The electrons are attracted to the positive programming potential at the metal bit line 14a and the holes will be attracted to the grounded P+ substrate 20a just as holes from a P+ region would be so attracted.

This virtual P+ region is forward biased with respect to the N− region 28a, which thus injects a large number of holes into the P− epi region 22b of the substrate, thus forward biasing that region with respect to N+ region 22a, the source of the select transistor 16, thus injecting many electrons back into P− region 22b and sustaining the forward biasing of the "virtual" P+ region in N− region 28a. This is the common four-layer structure for SCR action, even though one of the layers is a virtual layer. The sustaining voltage for the hot spot will be a bias of at least about 2.5 to 3 volts across the dielectric to keep the temperature high. This phenomenon allows substrate hole injection only during programming.

The injected substrate current will discharge the adjacent antifuse substrate nodes to ground and will result in applying the voltage on the bit line 14a across whatever other unprogrammed antifuses in the array containing PROM cell 10a are connected to that bit line 14a. This not a problem because the impedance of the devices supplying the bit lines with programming current will clamp the voltage on the bit line to a value below that of the programming voltage of the antifuse dielectric at the instant the selected antifuse is blown.

In the read mode the current through the antifuse connection is low enough to avoid heating up the silicon enough to cause it to create the "virtual" P+ region and go into SCR latchup. The only remaining issue is the fact that the lightly doped N− region 28a does have a significant spreading resistance. This can be tailored somewhat by increasing the doping as much as possible without stopping the SCR action. This limit is presently believed to be about 1e19. In many applications this is not very important though as electrons injected into the N− region 28a by the surrounding N+ region 26a will lower the resistance of the N− region 28a. This will create a slight nonlinearity in the resistance of the device of only about 0.3V. This can easily be accounted for in the design of the circuit by setting the trip point of the sense amplifier somewhat higher, i.e., about 0.5 volt.

Figure 4:
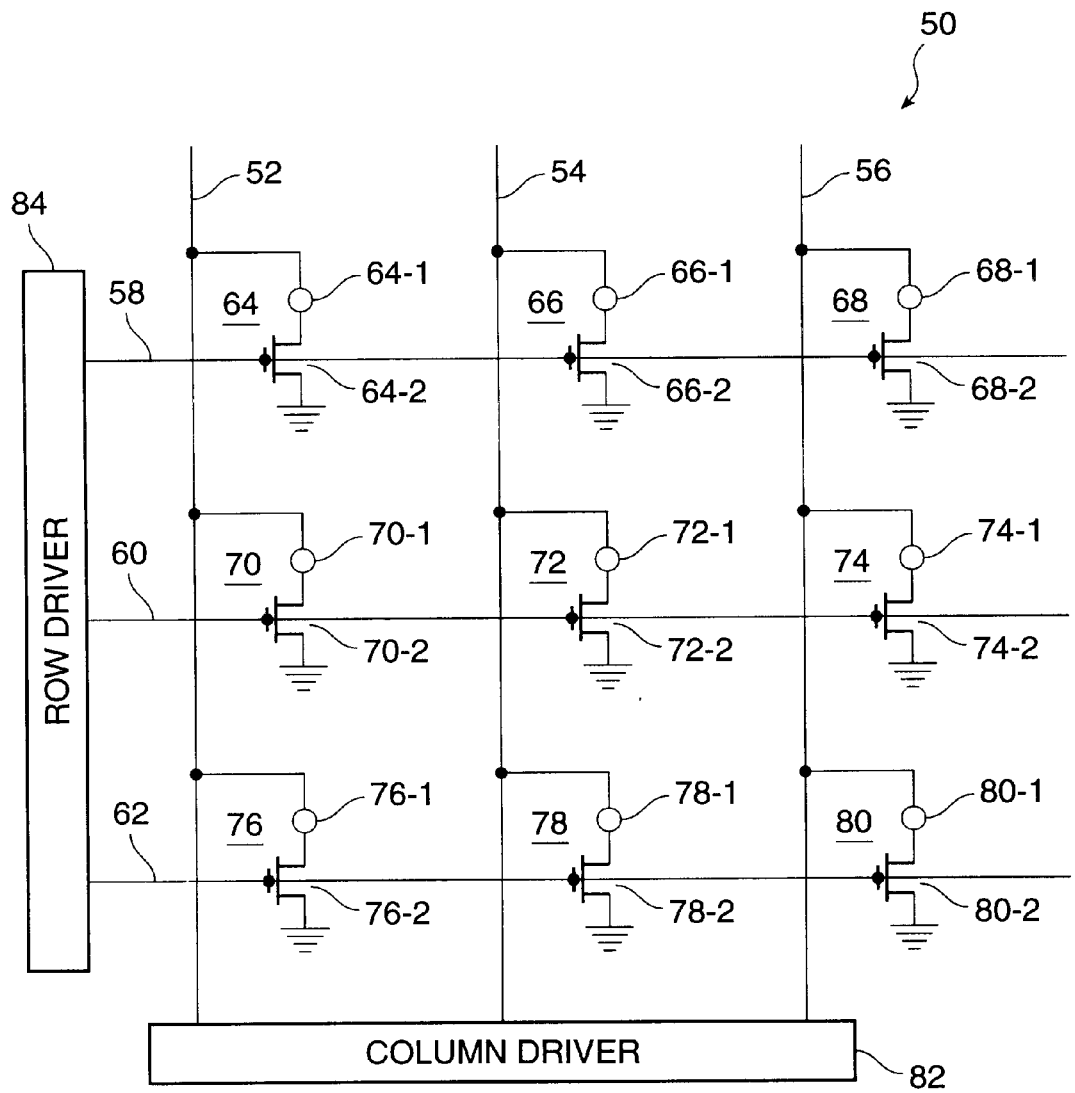
FIG. 4 is a schematic diagram of an illustrative PROM array according to the present invention.

The PROM cell of the present invention may be advantageously employed as an element in a practical PROM array. FIG. 4 is a schematic diagram of the core of an illustrative PROM array 50 according to this aspect of the present invention. While PROM array 50 is shown as a 3 by 3 array, persons of ordinary skill in the art will observe that it is merely illustrative and that PROM arrays of arbitrary size are possible using the technology of the present invention.

Bit line 52 is associated with a first column of array 50. In addition, bit lines 54 and 56 are associated with second and third columns of array 50. Similarly, word line 58 is associated with a first row of array 50. In addition, word lines 60 and 62 are associated with second and third rows of array 50.

Array 50 includes nine PROM cells. PROM cells 64, 66, and 68 comprise the first row of the array; PROM cells 70, 72, and 74 comprise the second row of the array; PROM cells 76, 78, and 80 comprise the third row of the array. PROM cells 64, 70, and 76 comprise the first column of the array; PROM cells 66, 72, and 78 comprise the second column of the array; PROM cells 68, 74, and 80 comprise the third column of the array.

Each bit line is connected to the lower antifuse electrode of the antifuse in all of the cells in its column. Bit line 52 is connected to the lower electrodes of antifuses 64-1, 70-1, and 76-1 bit line 54 is connected to the lower electrodes of antifuses 66-1, 72-1, and 78-1, bit line 56 is connected to the lower electrodes of antifuses 68-1, 74-1, and 80-1.

Similarly, each word line is connected to the upper antifuse electrode of the antifuse in all of the cells in its row. Word line 58 is connected to the upper electrodes of antifuses 64-1, 66-1, and 68-1, Word line 60 is connected to the upper electrodes of antifuses 60-1, 72-1, and 74-1, Word line 62 is connected to the upper electrodes of antifuses 76-1, 78-1, and 80-1.

The peripheral circuits necessary for implementation of array 50 are well known to those of ordinary skill in the art and will not be disclosed in detail herein. As win be appreciated by skilled persons, bit lines 52, 54, and 56 are driven by column decoder/driver 82 and word lines 58, 60, and 62 are driven by row decoder/driver 84. Address decoding is well understood in the art.

To program any PROM cell in array 50, the bit line and word line associated with that cell are asserted in programming mode with programming mode voltages, causing the appropriate antifuse to program as taught herein. For example, to program PROM cell 72, programming mode voltages are asserted on bit line 54 and word line 60.

To read any cell in the array 50, the bit line and word line associated with that cell are asserted in read mode with read mode voltages, causing the appropriate antifuse to be read as taught herein. For example, to read PROM cell 72, read mode voltages are asserted on bit line 54 and word line 60.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A PROM cell having an antifuse programming element, formed in a semiconductor substrate comprising:

an antifuse PROM cell including a first region in the semiconductor substrate forming a lower antifuse electrode, said first region doped at low levels of about 1e18 with phosphorus, an antifuse layer formed exclusively over said lower antifuse electrode, and an upper antifuse electrode formed from a selected portion of an antifuse polysilicon layer;

a bit line coupled to said upper antifuse electrode;

an N-Channel select transistor having a drain formed from a first N+ region formed in said substrate, said first N+ region connected to said lower antifuse electrode, a source formed from a second N+ region formed in said substrate and spaced apart from said first N+ region to form a channel therebetween, said source coupled to ground, and a gate disposed over and insulated from said channel, said gate coupled to a word line.

2. The PROM cell of claim 1 wherein said first and second N+ regions are doped with arsenic in a concentration from between about 1e19 to between about 1e21.

3. The PROM cell of claim 1 wherein said gate comprises a portion of a polysilicon layer forming a word line.

4. The PROM cell of claim 1 wherein said bit line is a metal interconnect line and is coupled to said upper antifuse electrode via a contact.

5. The PROM cell of claim 1 wherein said N-Channel select transistor has a width smaller than 8 microns.

6. A semiconductor structure for programming an antifuse comprising:

an antifuse including a first region in a semiconductor substrate forming a lower antifuse electrode, said first region doped at low levels around 1e18 with phosphorus, an antifuse layer formed exclusively over said lower antifuse electrode, and an upper antifuse electrode formed from a selected portion of an antifuse polysilicon layer;

an interconnect line coupled to said upper antifuse electrode;

an N-Channel programming transistor having a drain formed from a first N+ region formed in said substrate, said first N+ region connected to said lower antifuse electrode, a source formed from a second N+ region formed in said substrate and spaced apart from said first N+ region to form a channel therebetween, said source coupled to ground, and a gate disposed over and insulated from said channel, said gate coupled to a programming line.

7. The semiconductor structure of claim 6 wherein said first and second N+ regions are doped with arsenic in a concentration from between about 1e19 to between about 1e21.

8. The semiconductor structure of claim 6 wherein said gate comprises a portion of a polysilicon layer forming a word line.

9. The semiconductor structure of claim 6 wherein said interconnect line is a metal interconnect line and is coupled to said upper antifuse electrode via a contact.

10. The semiconductor structure of claim 6 wherein said N-Channel programming transistor has a width smaller than about 8 microns.

11. A PROM array on a semiconductor substrate comprising:

a plurality of word lines defining rows in said array;

a plurality of bit lines defining columns of said array;

a plurality of antifuse PROM cells in said array, each one of said PROM cells associated with a row and a column of said array, each PROM cell including a first region in the semiconductor substrate forming a lower antifuse electrode, said first region doped at low levels of about 1e18 with phosphorus, an antifuse layer formed exclusively over said lower antifuse electrode, and an upper antifuse electrode formed from a selected portion of an antifuse polysilicon layer, the upper antifuse electrode of each PROM cell coupled to the one of said bit lines associated with the column of said array containing that PROM cell, each said PROM cell further comprising a select transistor having a drain coupled to said lower antifuse electrode, a source coupled to ground, and a gate coupled to the one of said word lines associated with the row of said array containing that PROM cell.

* * * * *